United States Patent [19]

Hwang et al.

[11] Patent Number: 5,614,113
[45] Date of Patent: Mar. 25, 1997

[54] METHOD AND APPARATUS FOR PERFORMING MICROELECTRONIC BONDING USING A LASER

[75] Inventors: Ming J. Hwang, Richardson; Harold J. Dowell, McKinney, both of Tex.

[73] Assignee: Texas Instruments Incorporated, Dallas, Tex.

[21] Appl. No.: 437,124

[22] Filed: May 5, 1995

[51] Int. Cl.$^6$ .................................................. B23K 26/00
[52] U.S. Cl. ................................ 219/121.64; 219/121.63
[58] Field of Search .......................... 219/121.63, 121.64, 219/121.6, 121.86; 228/180.5, 4.5

[56] References Cited

U.S. PATENT DOCUMENTS

| | | | |
|---|---|---|---|
| 4,534,811 | 8/1985 | Ainslie et al. | 219/121.63 |
| 4,893,742 | 1/1990 | Bullock | 219/121.64 |
| 4,926,022 | 5/1990 | Freedman | 219/121.64 |
| 4,963,714 | 10/1990 | Adamski et al. | 219/121.64 |
| 5,244,140 | 9/1993 | Ramsey et al. | 228/110.1 |
| 5,298,715 | 3/1994 | Chalco et al. | 219/121.64 |
| 5,452,841 | 9/1995 | Sibata et al. | 228/180.5 |

FOREIGN PATENT DOCUMENTS

| | | | |
|---|---|---|---|
| 249570 | 9/1987 | Germany | 228/4.5 |
| 56-148837 | 11/1981 | Japan | 228/4.5 |
| 59-2333 | 1/1984 | Japan | 228/4.5 |
| 63-78543 | 4/1988 | Japan | 228/180.5 |
| 63-283140 | 11/1988 | Japan | 228/4.5 |
| 3-285336 | 12/1991 | Japan | 228/180.5 |
| 5-109808 | 4/1993 | Japan | 228/180.5 |

OTHER PUBLICATIONS

"Discrete Wire Bonding Using Laser Energy," P. Chalco, A. Gupta, B. Hussey, R. Hodgson and G. Arjavalingam, *Semiconductor International*, May 1988, pp. 130–131.

"Intrinsic Thermocouple Monitor for Laser Wirebonding," Brian Hussey, Gnanalingam Arjavalingam, Arunava Gupta, Pedro A. Chalco and H. Tong, *IEEE Transactions on Components, Packaging and Manufacturing Technology*, Part A., vol. 18. No. 1, Mar. 1995, pp. 206–214.

*Primary Examiner*—Geoffrey S. Evans
*Attorney, Agent, or Firm*—Alan K. Stewart; W. James Brady, III; Richard L. Donaldson

[57] ABSTRACT

The method and apparatus utilize a laser to heat bond pads. While the bond pads are hot, a wire is bonded to the bond pad. The method and apparatus of the present invention may also be used to heat a lead finger of an integrated circuit lead frame using a laser and to bond a wire to the lead finger while the lead finger is hot.

9 Claims, 1 Drawing Sheet

METHOD AND APPARATUS FOR PERFORMING MICROELECTRONIC BONDING USING A LASER

TECHNICAL FIELD OF THE INVENTION

The invention relates generally to integrated circuit interconnection and more particularly to a method and apparatus for performing microelectronic bonding using a laser.

BACKGROUND OF THE INVENTION

A common technique for making microelectronic circuit connections between the die of an integrated circuit device and the pins of that device is wire ball bonding. The die typically has one or more bond pads electrically coupled to the microelectronic circuitry. These bond pads are often comprised of aluminum or an aluminum alloy. Each bond pad has a wire, often a gold wire, bonded to it and a corresponding lead finger. A lead finger is a conductor that serves as, or is connected to, one of the leads of the integrated circuit device. The bond formed between the wire and the bond pad creates an intermetallic structure. The strength of the intermetallic structure depends upon a number of factors, including the temperature at which the bond is formed. Higher temperatures tend to improve the extent of intermetallic coverage. The highest bond strength is obtained by achieving maximum intermetallic coverage.

One of the most widely used processes for microelectronic bonding is thermosonic bonding. In a thermosonic bonding process, the die of the integrated circuit and, hence, the bond pads are heated to a relatively high temperature. Such heating is normally accomplished using a heater block. A capillary holds a wire with a ball formed at the end. This capillary is lowered so that the ball contacts the bond pad. At this point, the capillary applies mashing force to the ball and also supplies ultrasonic energy to form the bond. The other end of the wire is then stitch bonded to the appropriate lead finger on the lead frame.

Normally, the die must be heated to a high temperature, sometimes as high as between 240° C. and 290° C. Some modern devices, such as micromechanical devices cannot, without damage, be heated to temperatures beyond approximately 80° C. during the bonding process. For such devices, microelectronic bonding necessarily must occur at lower temperatures. Heat is an important variable in intermetallic formation, however, and it is more difficult to achieve adequate intermetallic bonding at lower temperatures.

Heating the lead frame of an integrated circuit during the wire ball bonding process can create a number of problems. Heat can cause deformation of the lead frame, causing stress in one or more lead fingers. Heat can also cause two or more lead fingers to bend closer to one another. Such bending sometimes causes lead fingers to be bonded together when a stitch bond is made. This phenomenon is particularly problematic with modern VLSI circuits that have a high pin count. Also, because the lead fingers are heated when the wire is attached during the bonding process, subsequent cooling of the lead finger may cause it to bend in a direction such that the wire is under tension. Tension due to lead finger bending may decrease the longevity of the bond.

Texas Instruments Incorporated has developed a high frequency ultrasonic bonding process that can achieve good intermetallic bonding at lower temperatures. That process is described, for example, in U.S. Pat. No. 5,244,140, entitled "Ultrasonic Bonding Process Beyond 125 KHz." This ultrasonic bonding process, however, causes the capillary to wear out faster due to the higher frequency ultrasonic energy needed to form the bond.

A process is needed that allows adequate intermetallic formation using lower frequency thermosonic bonding without the need for heating the die and lead frame to high temperatures.

SUMMARY OF THE INVENTION

The present invention achieves bonds with good intermetallic formation, without the need for either high frequency ultrasonic energy, or heating of the entire lead frame and die to high temperatures. In accordance with one aspect of the present invention, a bond pad is heated using a laser. A wire is then bonded to the bond pad while the bond pad is hot. In accordance with another aspect of the present invention, a lead finger is heated using the laser and then a wire is bonded to the lead finger while the lead finger is hot.

The invention has several important technical advantages. Because the bond pad and lead fingers are heated with a laser, those surfaces may be heated quickly by pulsing a laser for several milliseconds or less. Fast laser heating is substantially adiabatic and avoids the need to heat the entire lead frame and die using a heater block. Because the process is substantially adiabatic, little or no heat is transferred from the bond pad to the die, or from the lead finger to the rest of the lead frame. The method and apparatus of the present invention can, therefore, achieve the benefits of bonding at high temperatures without the need to heat the entire lead frame and die to those temperatures. Instead, the heating is rapid and localized and does not significantly affect the remainder of the die and/or lead frame.

The invention may be advantageously used for microelectronic bonding in devices that cannot withstand the high temperatures often used for thermosonic bonding. There is no need to use high frequency ultrasonic energy, thus increasing the life of the capillary. Because the invention allows localized heating, outgassing of contamination particles is drastically reduced.

The invention lowers the cost of a wire ball bonder because no heater block is required to heat the lead frame and die. This simplifies the design of a wire ball bonder and eliminates a costly, disposable part. Elimination of the heater block avoids difficulties with uniform heating because the laser may be focused on each bond pad and lead finger with a high degree of precision.

In existing systems, no bonding can occur while the heater block heats the die and lead frame. The invention can achieve lower cycle times for many semiconductor devices because there is no need to wait for the device to heat up.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
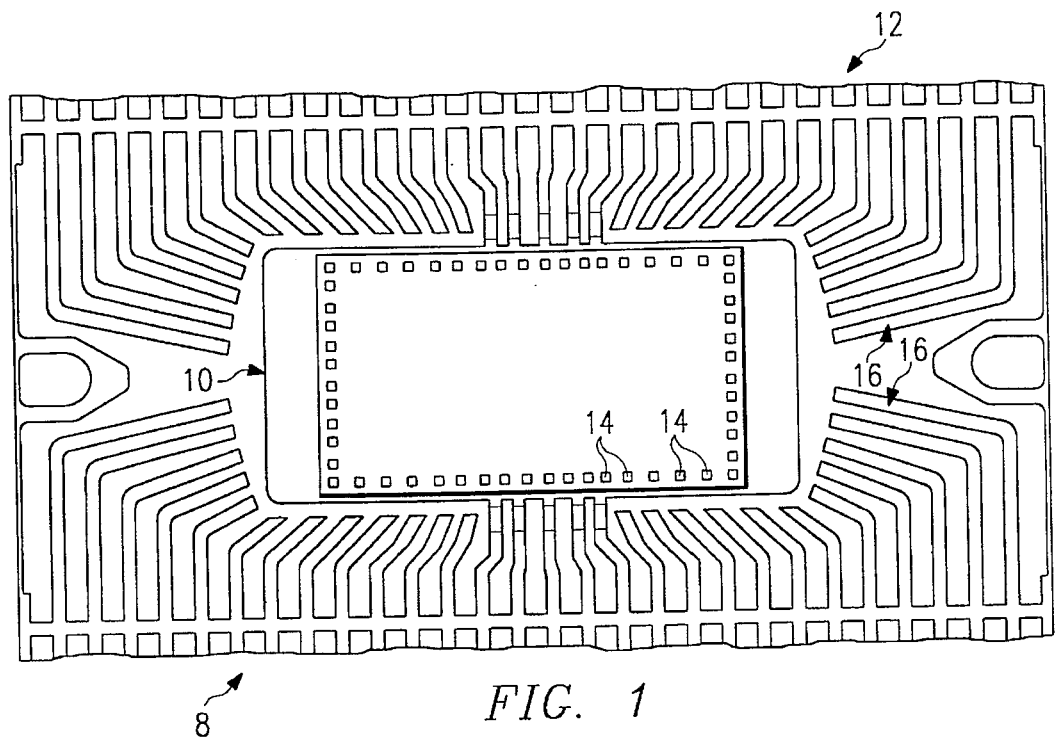
FIG. 1 illustrates the die of a semiconductor device attached to a lead frame.
Figure 2:
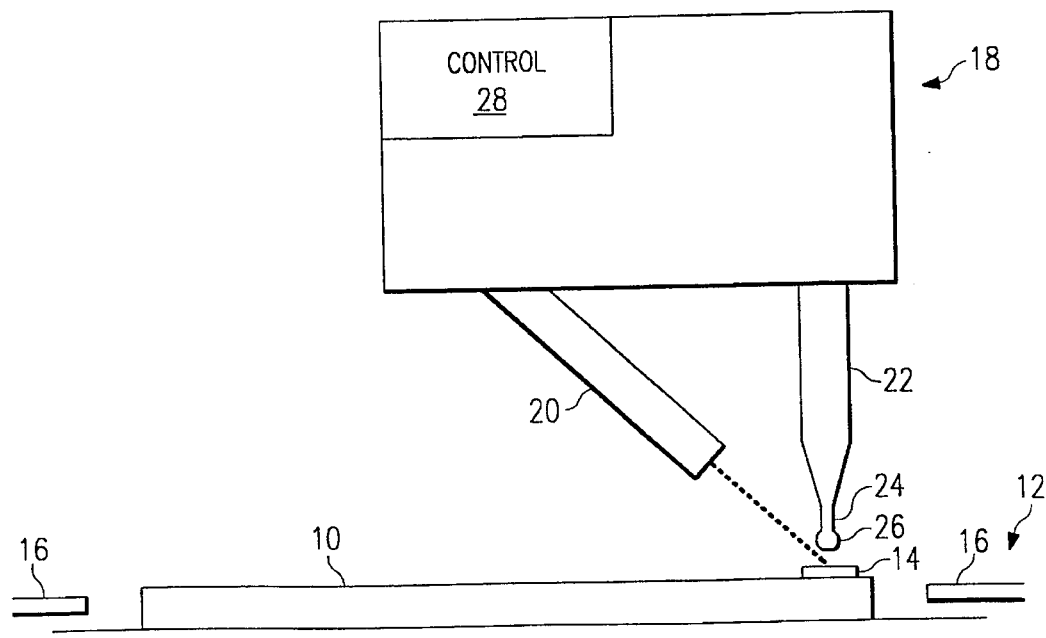
FIG. 2 illustrates a bonder constructed in accordance with the teachings of the present invention.

The preferred embodiment of the present invention and its advantages are best understood by referring to FIGS. 1 and 2 of the drawings, like numerals being used for like and corresponding parts of the various drawings.

FIG. 1 illustrates an example of an integrated circuit for which the invention may be used to interconnect the bond pads and lead fingers. Integrated circuit 8 comprises die 10, lead frame 12, bond pads 14 and lead fingers 16. Die 10 can be any semiconductor device, such as a memory device. The circuitry of die 10 is electrically connected to a plurality of bond pads 14. Bond pads 14 may be formed from a metallic compound such as aluminum or an aluminum alloy. Other metals could also be used, such as gold.

Die 10 is coupled to lead frame 12. Lead frame 12 comprises a plurality of lead fingers 16. Each lead finger 16 comprises a conductor that will form, or is coupled to, one of the leads of integrated circuit 8. The method and apparatus of the present invention may be used for wire ball bonding of bond wires between one of the bond pads 14 and its corresponding lead finger 16.

FIG. 2 illustrates a bonder 18 constructed in accordance with the teachings of the present invention. Bonder 18 comprises laser 20, capillary 22, and control circuitry 28. Laser 20 and capillary 22 are coupled to and controlled by control circuitry 28.

The operation of bonder 18 will now be discussed. In general, die 10 is secured to a lead frame 12. Die 10 could also be secured to a chuck. First, wire 24 is bonded to bond pad 14. In this example, wire ball bonding is used. The end of wire 24 is heated for formation of ball 26 as is well known in the art. Laser 20 is focused on bond pad 14. After focusing, laser 20 is pulsed for a predetermined amount of time. The duration of the pulsing of laser 20 may depend upon the desired temperature of bond pad 14, the thickness of bond pad 14, and the amount of energy that laser 20 is capable of delivering. In this example, the laser is pulsed for a period of less than one millisecond. Ball 26 could be formed before or after the heating of bond pad 14.

After pad 14 has been heated by laser 20, capillary 22 then moves wire 24 such that ball 26 contacts bond pad 14. Capillary 22 may provide mashing force and/or ultrasonic energy to aid in intermetallic formation. Such ultrasonic energy could be low frequency energy around 60 KHz or high frequency energy exceeding 100 KHz.

Control circuitry 28 synchronizes the operation of laser 20 and capillary 22. Control circuitry 28 insures that bond pad 14 has been sufficiently heated before capillary 22 supplies mashing force and/or ultrasonic energy. Control circuitry 28, then, synchronizes capillary 22 with the heating of bond pad 14 by laser 20.

After wire 24 has been bonded to bond pad 14, bonder 18 may then be used to bond wire 24 to the corresponding lead finger 16. Bonding to the lead finger could also occur first. For wire ball bonding, however, bonding to the bond pad preferably occurs first. As with the microelectronic bond step above, laser 20 first heats the appropriate lead finger 16. The heating of that lead finger 16 occurs by pulsing laser 20 as described above. After the appropriate lead finger 16 is heated sufficiently, capillary 22 bonds wire 24 to that lead finger 16. A stitch bond is preferably used for this bond. Control circuitry 28 synchronizes laser 20 and capillary 22 as above.

Laser 20 can be any type of laser capable of heating bond pads 14 and lead fingers 16. Laser 20 should preferably be able to focus directly on a bond pad 14 and a lead finger 16. Bond pad 14 is typically about 3½ mil×3½ mil. Existing semiconductor lasers are capable of focusing accurately on this area.

Because laser 20 can heat bond pad 14 locally and quickly, the heating process is essentially adiabatic. In other words, little or no heat is transferred to other portions of die 10. Similarly, the heating of lead fingers 16 is also essentially adiabatic. Because little or no heat is transferred to the remainder of die 10 and/or lead frame 12, the invention can be used for wire ball bonding of circuits incapable of withstanding high temperatures. Good intermetallic bonding can be achieved, however, because each individual bond pad 14 and lead finger 16 can be heated essentially adiabatically to the temperature required to obtain a good bond. Bonder 18 is thus advantageous in that it can be used to obtain good intermetallic bonding that would be otherwise unattainable for heat sensitive devices, such as micromechanical devices.

Bonder 18 can be used for many applications without the need for high frequency ultrasonic energy. Although capillary 22 could supply high frequency ultrasonic energy (over 100 KHz), lower frequencies (such as 60 KHz) may be used, thus increasing the useful life of capillary 22.

Bonder 18 also substantially eliminates contamination problems that sometimes result from microelectronic bonding. With existing processes, the extreme heat may cause outgassing of contamination particles from die 10. With the present invention, there is no need to heat die 10 to high temperatures, thus preventing substantial outgassing of contamination particles.

Existing designs also have a heater block that is ordinarily clamped to lead frame 12 and/or die 10. Such clamping leads to heat transfer problems and can distort and bend lead frame 12. Such distortion may cause two or more lead fingers 16 to become attached during the stitch bonding portion of the bonding process. The invention eliminates the need for such a heater block. In addition, bonder 18 can be made less expensive due to the elimination of the heater block.

Bonder 18 also may lower the cycle time for bonding as compared to existing systems. With bonder 18, there is no need to wait for a heater block to heat lead frame 12 and/or die 10 before beginning the bonding process. Instead, laser 20 heats each bond pad 14 and lead finger 16 rapidly—in a few milliseconds or less.

Although the present invention and its advantages have been described in detail, it should be understood that various changes, substitutions and alterations can be made therein without departing from the spirit and scope of the invention as defined by the appended claims.

What is claimed is:

1. A method for microelectronic bonding, comprising:

heating a bond pad by pulsing a laser for less than one millisecond while the laser is focused on the bond pad; and bonding a wire to the bond pad while the bond pad is hot.

2. The method of claim 1, further comprising:

heating a lead finger using the laser; and bonding a wire to the lead finger while the lead finger is hot.

3. The method of claim 2, wherein said heating a lead finger step further comprises:

pulsing the laser for a predetermined time while the laser is focused on the lead finger.

4. The method of claim 1, wherein said bonding step further comprises:

bonding the wire to the bond pad while the bond pad is hot using a capillary that supplies ultrasonic energy to the wire in response to the laser.

5. An apparatus for microelectronic bonding, comprising:

a laser operable to heat a bond pad;

a capillary operable to bond a wire to the bond pad in response to the laser; and a control circuit coupled to the laser and the capillary, the control circuit operable to pulse the laser for less than one millisecond while the laser is focused on the bond pad to heat the bond pad prior to the capillary bonding the wire to the bond pad.

6. The apparatus of claim 5 wherein said laser is a semiconductor laser.

7. The apparatus of claim 5 wherein said laser is further operable to heat a lead finger and wherein the capillary is further operable to bond the wire to the lead finger in response to the laser.

8. The apparatus of claim 5 wherein the capillary applies ultrasonic energy with a frequency of approximately 60 KHz at an interface between the wire and the bond pad.

9. The apparatus of claim 5 wherein the capillary applies ultrasonic energy with a frequency exceeding 125 KHz at an interface between the wire and the bond pad.

* * * * *